(12) United States Patent
Porter

(10) Patent No.: US 7,417,427 B2
(45) Date of Patent: Aug. 26, 2008

(54) MAGNETIC RESONANCE DATA ACQUISITION METHOD AND APPARATUS

(75) Inventor: David Andrew Porter, Hook (GB)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 11/733,801

(22) Filed: Apr. 11, 2007

(65) Prior Publication Data

US 2007/0236217 A1    Oct. 11, 2007

(30) Foreign Application Priority Data

Apr. 11, 2006    (DE) .................. 10 2006 017 049

(51) Int. Cl.
*G01V 3/00* (2006.01)
(52) U.S. Cl. .................. 324/306; 324/309
(58) Field of Classification Search ........... 324/306, 324/307, 309
See application file for complete search history.

(56) References Cited

U.S. PATENT DOCUMENTS

| | | | |
|---|---|---|---|
| 5,311,132 A | 5/1994 | Noll et al. | |
| 6,184,682 B1 * | 2/2001 | Ehman et al. ............ | 324/309 |
| 6,331,777 B1 * | 12/2001 | Van Den Brink et al. .... | 324/312 |
| 6,771,068 B2 * | 8/2004 | Dale et al. ............... | 324/307 |
| 6,842,000 B2 | 1/2005 | Norris et al. | |
| 7,205,763 B2 * | 4/2007 | Porter .................... | 324/306 |
| 7,298,143 B2 * | 11/2007 | Jaermann et al. .......... | 324/307 |

FOREIGN PATENT DOCUMENTS

EP    0 909 958    4/1999

OTHER PUBLICATIONS

"3D Diffusion Tensor Imaging With 2D Navigated Turbo Spin Echo," Mengershausen, MAGMA, vol. 18 (2005), pp. 206-216.
"Navigator Motion Correction of Diffusion Weighted 3D SSFP Imaging," Bosak et al, MAGMA, vol. 12, (2001) pp. 167-176.
"The Use of Intelligent Re-Acquisition to Reduce Scan Time in MRI Degraded by Motion," Nguyen et al, Proceedings ISMRM, 6th Annual Meeting, Sydney, Australia (1998) p. 134.
"Isotropic Diffusion-Weighted Multishot Imaging Using Automatic Reacquisition," Nguyen et al, Proceedings ISMRM 7th Annual Meeting, Philadelphia, PA (1999) p. 559.
"Multi-Shot Diffusion-Weighted EPI with Readout Mosaic Segmentation and 2D Navigator Correction," Porter et al, Proceedings ISMRM, 12th Annual Meeting, Kyoto, Japan (2004), p. 442.

* cited by examiner

*Primary Examiner*—Louis M Arana
(74) *Attorney, Agent, or Firm*—Schiff Hardin LLP

(57) ABSTRACT

In a method and magnetic resonance apparatus for acquisition of image data for a magnetic resonance image, the image data are acquired with an acquisition sequence, in which a k-space matrix corresponding to the image data is scanned in segments with at least two partial acquisitions and in which each of the partial acquisition includes a navigator signal in addition to the measurement signal with which a specific k-space segment is scanned, with which navigator signal a same navigator segment of the k-space matrix is scanned. In one of the partial acquisitions a measure is determined that characterizes the breadth of the distribution of signal values of the navigator signal with regard to the k-space matrix and the partial acquisition is repeated if and when the measure lies outside of a tolerance range.

24 Claims, 6 Drawing Sheets

MAGNETIC RESONANCE DATA ACQUISITION METHOD AND APPARATUS

BACKGROUND OF THE INVENTION

1. Field of the Invention

The present invention concerns a method for acquisition of magnetic resonance image data, as well as a magnetic resonance apparatus operable according to such a method.

2. Description of the Prior Art

Magnetic resonance (MR) imaging is a known, firmly established modality that is particularly used in medical imaging. A body to be examined is introduced into a strong, homogeneous static magnetic field (known as the basic magnetic field) that causes an alignment of the nuclear spins of atomic nuclei in the body, in particular of hydrogen atomic nuclei (protons) bound to water. These nuclei are excited to a precessional movement around direction of the basic magnetic field by means of radio-frequency excitation pulses. After the end of a radio-frequency (RF) excitation pulse, the nuclear spins precess at a frequency that is known as the Larmor frequency, which depends on the strength of the basic magnetic field. Due to various interaction types, the nuclear spins align (with a characteristic time curve) again along the preferred direction provided by the basic magnetic field. The time curve is, among other things, tissue-dependent and can be described using a characteristic known as the relaxation time. By computational and/or measurement analysis of the integral, radio-frequency magnetic resonance signals, an image can be generated from the spatial distribution of the spin density in connection with the respective relaxation times. The association of the nuclear magnetic resonance signals (that can be detected as a consequence of the precessional movement) with the location or their origin ensues by the application of magnetic field gradients. For this purpose, gradient fields are superimposed on the basic magnetic field and controlled such that an excitation of the nuclei ensues only in a slice to be imaged. An RF coil device is required both for RF excitation of the nuclear spins and for detection of the nuclear response signals. Imaging systems based on these physical effects are known as magnetic resonance imaging (MRI) systems.

In MR, the acquired measurement signals and the image data to be reconstructed therefrom are linked via a Fourier transformation. For example, in order to acquire tomographic image data of a slice of a subject to be examined, a two-dimensional space (known as k-space) is sampled by a series of measurement signals and the image is subsequently reconstructed by a Fourier transformation of a two-dimensional k-space matrix determined from the measurement signals Since a measurement signal typically arises from the radiation of an excitation pulse, the activation of diverse gradient fields, and the acquisition of the decaying transverse magnetization of the nuclear spins, it can sometimes take a relatively long time until the two-dimensional k-space matrix has been sampled at a resolution necessary for the image quality.

In order to address the problem of long acquisition time, various methods that are known as "single shot" methods have been developed. In these methods, k-space is scanned with the measurement signal after a single excitation pulse ("single shot") by skillful switching of the gradient fields, RF pulses or a combination of these, such that the image data can be acquired in a shorter time.

These methods are known, among other things, as gradient echo sequences or EPI (echoplanar imaging) sequences, spin echo sequences and GRASE (gradient and spin echo) sequences. A disadvantage of the cited methods is the often insufficient resolution with which k-space is covered, such that the image data do not always exhibit the necessary degree of detail. The "single shot" methods, in particular EPI sequences, are additionally prone to susceptibility and eddy current artifacts that in part significantly reduce the quality of the reconstructed images.

Methods known as "multi-shot" methods represent a compromise between fast acquisition and good image quality. In such methods, k-space is scanned not with a single excitation pulse (with successive acquisition of the measurement signal) but rather successively in segments using a number of excitation pulses. By such segmented scanning, the entirety of k-space is canned by specific segments of the k-space matrix being respectively scanned upon each excitation pulse. The individual segments can be scanned in this manner with a greater precision than given the "single shot" methods. The image can then be reconstructed, for example, from the measurement signals by Fourier transforming the individual k-space segments into partial images, and the partial images are subsequently added.

A problem that occurs in "multi-shot" methods is an increased sensitivity to movement artifacts. In particular, the phase of the transverse magnetization of the excited spins changes when excited spins move along magnetic field gradients. Given a simple movement, such as a translation, during the measurement signal acquisition after an excitation pulse, a global phase shift that is reflected as a global phase shift in image space is impressed on the transverse magnetization. In the case of more complex movements during the measurement signal acquisition (for example pulsing expansions caused by the blood flow), a locally-varying phase distribution that is reflected in the reconstruction image as a locally-varying phase distribution is impressed on the transverse magnetization.

In "single shot" methods, a locally varying phase distribution in the reconstructed image typically does not represent a problem, since primarily the magnitude of the transverse magnetization of the spins is decisive for the reconstructed image. However, when "multi-shot" methods are used, the entire image is calculated from the individual partial images corresponding to the k-space segments. If the various partial images respectively exhibit different phase distributions since the subject to be examined had different movement patterns at the respective acquisition points in time of the associated k-space segments, the different phase distributions lead to significant disruptive interferences in the image reconstruction.

Strong field gradients (primarily given high diffusion values) are activated in diffusion-weighted imaging, in which "multi-shot" methods are typically applied. A particularly distinct phase distribution is thereby impressed on the transverse magnetization of a moving subject, such that the artifacts just described occur particularly prominently due to the movement-induced different phase distribution in the individual partial images.

One possibility to compensate for this type of movement-induced artifacts is the use of what are known as navigator signals or navigator echoes. A navigator signal means a measurement signal that is acquired after each excitation pulse in addition to the measurement signal of the k-space segment, and with which the same (advantageously central) segment of k-space is always scanned.

The measurement signals of the different k-space segments cannot be directly compared with one another since the k-space segments typically do not overlap. The navigator signals that always acquire the same k-space segment, however, can be compared with one another due to this. The phase distribution that has occurred upon the respective acquisition of the associated k-space segments therefore can be determined by the evaluation of the navigator signals and through their comparison. The partial images belonging to the k-space segments thus can be phase-corrected and can be added largely without interference in the reconstruction of the image.

Although this correction method delivers considerably better images than a reconstruction without consideration of the phase distribution, this method has its limitations. The navigator signal typically covers only a relatively small central region of the k-space matrix. The phase distribution calculated from this region therefore reflects only the low-frequency components. If the movement of the subject during the acquisition of a measurement signal and navigator signal was complex, such that the partial image exhibits a strongly-varying phase distribution (thus a phase distribution with impressed radio-frequency components), it can occur that this phase distribution is determined only insufficiently by the navigator signal.

In "The use of intelligent re-acquisition to reduce scan time in MRI degraded by motion" in Proceedings, ISMRM, 6th Annual Meeting, Sydney, Australia 1998, p. 134, Nguyen Q, Clemence M, Ordidge R J disclose a method with which the diffusion-weighted images can be improved using navigator echoes with regard to distortions due to ghost images. The navigator echo disclosed in this article is a one-dimensional navigator echo in the frequency coding direction. According to this article, the integrated navigator echo supplies a measure that indicates the image-to-ghost image ratio, and thus characterizes the quality of the image. The method furthermore implements diverse acquisition algorithms with which those echo signals whose navigator signals suggest a particularly disadvantageous image-to-ghost image ratio are repeatedly acquired.

A method based on this technique is disclosed by Nguyen Q, Thornton J, Ordidge R J in "sotropic diffusion-weighted multishot imaging using automatic reacquisition" in Proceedings, ISMRM, 7th Annual Meeting, Philadelphia, USA 1998, p. 559. A diffusion-weighted image is thereby acquired with a "multi-shot" spin echo sequence with navigator echoes. After acquisition of the measurement signals that navigator echo that characterizes a particularly low ghost image ratio is identified from the various navigator echoes. Using this navigator echo those echoes are now identified that cause the largest ghost image artifacts in the image. These echoes are thereupon reacquired.

The two articles do in fact disclose a method with which specifically those echoes can be identified that lead to ghost artifacts, such that these echoes can be reacquired. Other types of artifacts that, for example, are caused by a radio-frequency phase distribution in the individual partial images are still not accounted for by this method, such that improving the image quality is still desirable.

SUMMARY OF THE INVENTION

An object of the present invention is to provide a method for acquisition of magnetic resonance image data with which an image of high quality with low artifact distortions can be reconstructed from the acquired measurement signals.

The object is inventively achieved by a method for acquisition of image data in an magnetic resonance image wherein the image data are acquired with an acquisition sequence in which a k-space matrix corresponding to the image data is scanned in segments with at least two partial acquisitons in which each of the partial acquisition includes a navigator signal in addition to the measurement signal with which a specific k-space segment is respectively scanned, with which navigator signal a same multi-dimensional navigator segment of the k-space matrix is respectively scanned. In at least one of the partial exposures a measure is determined that characterizes the breadth of the distribution of signal values of the navigator signal with regard to the k-space matrix, and the partial exposure is repeated if and when the measure lies outside of a tolerance range.

The acquisition sequence of the inventive method is consequently of the type known as a "multi-shot" sequence, wherein, in each partial acquisition, a navigator signal is respectively acquired in addition to the measurement signal. The measurement signals belonging to the individual k-space segments can be corrected in a known manner using the navigator signals so that an optimized reconstruction of the magnetic resonance images from the individual partial exposures is enabled. The phase distribution that has occurred in the acquisition of the measurement signal of the associated k-space segment due to a movement of the subject to be examined can be determined using the navigator signal. The partial images belonging to the k-space segments thus can be phase-corrected so that the image data are largely reconstructed in an optimized and interference-free manner.

Specific regions or segments of the k-space matrix are scanned with the measurement signals and the navigator signals, meaning that a specific signal value can be associated with each point of the scanned region of the k-space matrix through the measurement signal or the navigator signal. In particular, the signal values of a navigator signal show (when they are plotted relative to the k-space matrix) a distribution that exhibits a maximum in the center range of the k-space matrix and whose signal values decrease with increasing distance from the maximum. Such a distribution of the signal values with regard to the k-space matrix typically occurs with subjects examined in medical imaging. The precise distribution of the signal values thereby also depends on the phase distribution that has been induced by a movement of the subject to be examined during the acquisition.

In the inventive method a measure that characterizes the breadth of the distribution of signal values of the navigator signal with regard to the k-space matrix is determined in one of the partial acquisitions. The partial acquisition is repeated depending on whether the measure lies outside of a tolerance range.

Among other things, the phase distribution that was created by a specific movement pattern of the subject during the production of the partial acquisition is assessed using this measure. Depending on the complexity of the movement pattern, the phase distribution includes more or less strongly impressed radio-frequency components. For example, when the phase distribution exhibits a considerable radio-frequency component, the distribution of the signal values of the navigator signal with regard to the k-space matrix is significantly broader compared with a navigator signal with a predominantly low-frequency phase distribution.

The breadth of the distribution of the signal values of the navigator signal with regard to the k-space matrix is consequently assessed by the determination of the measure in a partial acquisition. If the distribution of the signal values exhibits a large breadth, this indicates a non-negligible portion of high frequencies in the frequency spectrum of the phase distribution, such that the phase distribution can be only insufficiently determined from the navigator signal (which typically scans a central region of the k-space matrix and which therefore detects only low-frequency portions of the phase distribution). In this case the partial acquisition is repeatedly acquired. In reverse, a measure lying within the tolerance range indicates a phase distribution that can be sufficiently precisely determined by the navigator signal.

During the repeated production of the partial acquisition the subject typically will exhibit a different (often more advantageous) movement pattern, such that the repeatedly produced partial acquisition can be used for the image reconstruction. If desired, in the repeated partial acquisition the breadth of the distribution of the signal values can also be determined relative to the k-space matrix and the acquisition can possibly be repeated again.

The partial acquisition in which the measure is determined can be a partial acquisition that is particularly important for the reconstruction of the image data, for example the partial acquisition that scans the central k-space segment. However, in all partial acquisitions a measure can also be determined such that all of those partial exposures are repeated in which the occurring movement-induced phase distribution is complex, such that they can only be insufficiently determined through the navigator signal.

The tolerance range can be established in different ways. One possibility is to establish the tolerance range a priori for a specific examination type, for example using preliminary tests. With such preliminary tests the breadth that the distribution of the signal values of the navigator signals typically exhibits can be estimated as well as how strongly the image quality is influenced thereby.

A partial acquisition—more precisely the breadth of the distribution of the signal values of its navigator signal—is evaluated and, if appropriate, is repeated in the inventive method. Magnetic resonance images that are reconstructed from the data acquired in this manner exhibit further artifacts, since those partial acquisitions from which the movement-induced phase distribution can only insufficiently be determined are repeatedly acquired.

The distribution of the signal values in a multi-dimensional range of the navigator signal is preferably used for the determination of the measure.

In a preferred embodiment of the method, the measure that characterizes the breadth of the distribution of the signal values of the associated navigator signal with regard to the k-space matrix is respectively determined in at least two partial acquisitions, in particular in each of the partial acquisitions. The tolerance range is thereupon determined by the determined measures being set in relation to one another.

In this manner the tolerance range is not established purely a priori, but rather is determined during the acquisition of the image data and is (since it is determined from the determined measures themselves) adapted to the respective conditions that have an influence on the breadth of the distribution of the signal values during an acquisition of the image data.

For example, an average value can be formed from the determined measures and the scatter of the determined measures can be calculated. In this manner the breadth of the distribution of the signal values that is typically to be expected in the individual navigator signals can be estimated as well as how much the individual measures deviate from one another. Those partial acquisitions whose measures indicate a particularly broad distribution of the signal values, characterize the outliers in the partial acquisitions for a repetition of the partial acquisition leads to significantly better image quality.

In a particularly simple embodiment, the tolerance range is determined by that measure that belongs to the navigator signal with the smallest breadth of the distribution of the signal values relative to the k-space matrix. This measure thus characterizes that navigator signal from which the phase distribution (which has occurred in the acquisition) can be particularly well determined. The other measures are now compared against this measure.

In a particularly simple embodiment the tolerance range is established as that range that lies below a threshold, the threshold being a multiple of that measure that belongs to the navigator signal with the smallest breadth of the distribution of the signal values relative to the k-space matrix. The factor with which this measure is multiplied in order to obtain the threshold depends on the respective examination and can be determined, for example, using preliminary tests.

All those measures that lie within the range consequently characterize the partial exposures whose navigator signals exhibit a relatively narrow distribution of the signal values relative to the k-space matrix and from whose navigator signals the phase distribution can be sufficiently precisely determined for the image reconstruction. Those measures that lie outside of the range characterize the partial exposures in which the phase distribution can only be inadequately determined and that therefore are repeatedly acquired.

In different embodiments of the invention, the measure characterizes the breadth of the distribution of the signal values relative to the k-space matrix in the readout direction and/or phase coding direction.

In which direction or in which directions the measure specifies the breadth of the distribution of the signal values depends on the form of the k-space segment scanned by the navigator signal. If, for example, the length of the k-space segment in the phase coding direction corresponds to the length of the entire k-space matrix, and the width of the k-space segment in the readout direction exhibits only a fraction of the width of the k-space matrix, the navigator signal with regard to the phase distribution contains significantly more information in the phase coding direction than in the readout direction. Here it is therefore advantageous to determine the width of the distribution in the readout direction since, given a disadvantageous movement pattern, the phase distribution in the readout direction is distinctly harder to determine than the phase distribution in the phase coding direction.

The determination of the breadth of the distribution of the signal values in the phase coding direction ensues in an analogous manner when the k-space segment only scans a portion of the k-space matrix in the phase coding direction, but the entire k-space matrix in the readout direction.

When the k-space segment scans only a portion of the k-space matrix in both directions it is advantageous to determine the breadth of the distribution of the signal values both in the phase coding direction and in the readout direction since then, given a disadvantageous movement pattern, the phase distribution can be determined only insufficiently in both directions.

In a preferred embodiment the measure is determined by forming a sum of absolute magnitudes of the signal values (that are respectively multiplied with a distance of their associated k-space coordinates from a k-space coordinate of a signal maximum of the distribution). The breadth of the distribution of the signal values is hereby assessed in a manner that ensues similar to an assessment of the scatter of a probability distribution using the average absolute deviation with regard to the maximum of the probability distribution.

When a measure $W_x$ that characterizes the breadth of the distribution of the signal values in the readout direction is determined in this embodiment, this can ensue according to the following correlation:

$$W_x = \sum_{k_y=0}^{n_y-1} \sum_{k_x=0}^{n_x-1} |S(k_x, k_y)| \cdot |k_x - \Omega_x|$$

wherein $k_x$ thereby characterizes the coordinate values of k-space in the readout direction, $k_y$ in the phase coding direction. $n_x$ and $n_y$ specify the number of the scanned data points in the readout direction and the phase coding direction, respectively. $S(k_x,k_y)$ is the complex k-space signal and $\Omega_x$ is the $k_x$-coordinate of the data point with the maximum signal amplitude.

A measure $W_y$ that characterizes the breadth of the distribution of the signal values in the phase coding direction can be characterized in an analogous manner:

$$G_y = \sum_{k_y=0}^{n_y-1} \sum_{k_x=0}^{n_x-1} |S(k_x, k_y)| \cdot |k_y - \Omega_y|$$

wherein $\Omega_y$ characterizes the $k_y$-coordinate of the data point with the maximum signal amplitude.

In a preferred embodiment, all those partial acquisitions in which the associated measure was respectively determined and in which the determined measure lies outside of the tolerance range are repeated.

In the event that more than one partial acquisition is repeated, an order of the repetition of the partial exposures advantageously conforms to the position of their associated k-space segments such that that partial acquisition to be repeated whose associated k-space segment lies most centrally is repeated first. In this manner those k-space segments are repeatedly acquired that have the greatest influence on the image reconstruction since they lie most centrally in the k-space matrix. If the acquisition of the partial exposures to be repeated should have to be terminated early, a magnetic resonance image with sufficient quality thus can nevertheless often be generated, since the partial exposures with centrally-situated k-space segments (which are more important for the image reconstruction) exhibit a sufficiently simple phase distribution.

The multi-dimensional navigator signal is advantageously a two-dimensional navigator signal.

The acquisition sequence preferably uses gradient echoes and/or spin echoes. Such acquisition sequences are often executed in a known manner in a "multi-shot" method, so that such acquisition sequences can be developed without great effort so as to accommodate the inventive method therein.

The acquisition sequence is advantageously an acquisition sequence for diffusion-weighted imaging. In these acquisition sequences, the partial exposures exhibit (due to a movement of the subject) a particularly distinct phase distribution in the relatively strong diffusion gradients, such that a particularly distinct improvement of the image quality is achieved by the application of the method in the diffusion-weighted imaging.

The above object also is achieved in accordance with the magnetic resonance apparatus with invention by a computer fashioned for implementation of the method.

DESCRIPTION OF THE PREFERRED EMBODIMENTS

Figure 1:
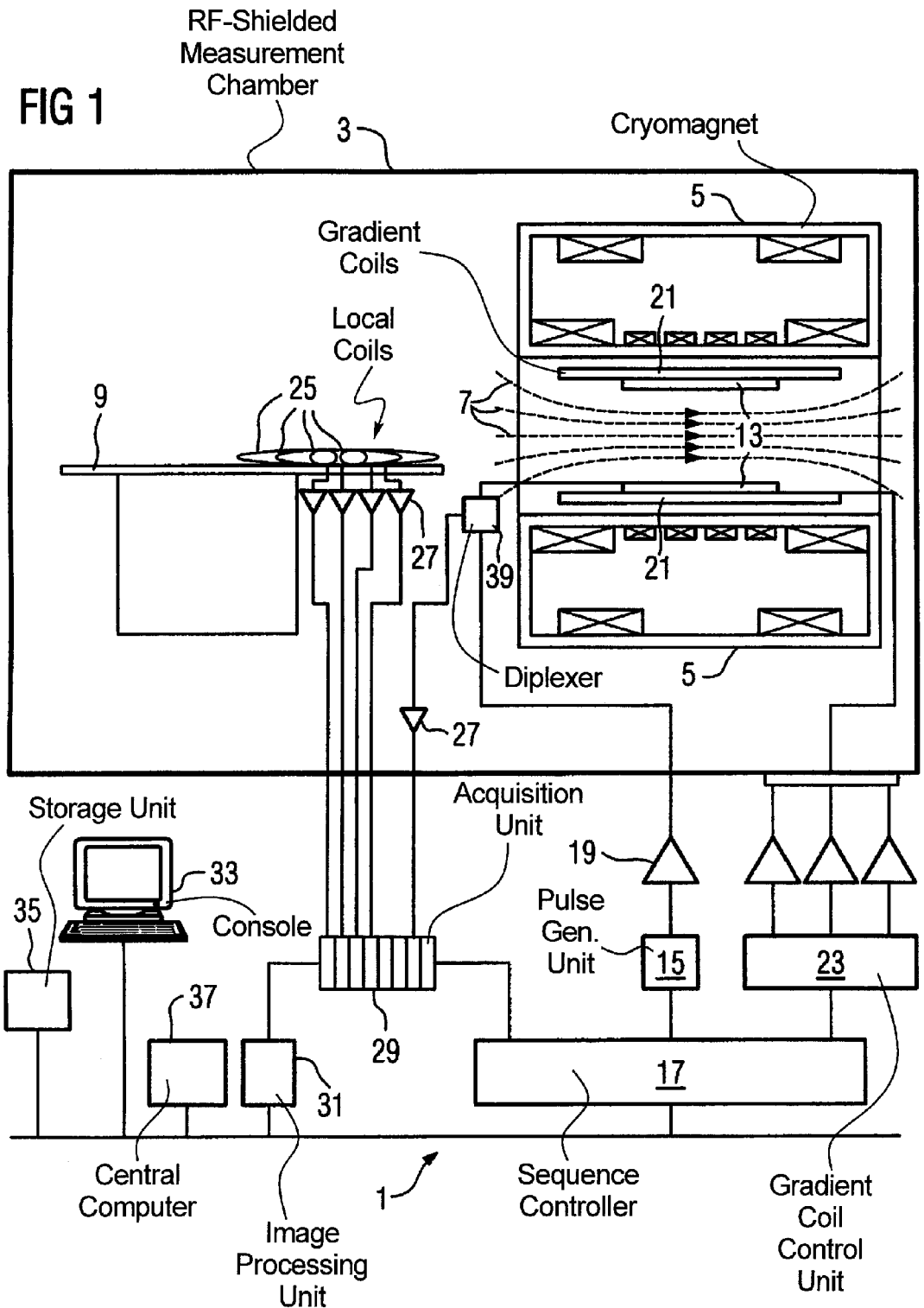
FIG. 1 schematically illustrates a magnetic resonance apparatus operable in accordance with the invention.

FIG. 1 schematically shows the design of a magnetic resonance apparatus 1. The components of the magnetic resonance apparatus 1 with which the actual method is implemented are located in a radio-frequency shielded measurement chamber 3. In order to examine a body by means of magnetic resonance imaging, various magnetic fields precisely matched to one another in terms of their temporal and spatial characteristics are radiated at the body.

A strong magnet (typically a cryomagnet 5 with a tunnel-like opening) generates a strong, static basic magnetic field 7 that typically amounts to 0.2 Tesla to 3 Tesla and more. A body (not shown) to be examined is placed on a patient bed 9 and positioned inside the basic magnetic field 7.

The excitation of the nuclear spins of the body ensues by radio-frequency excitation pulses that are radiated via a radio-frequency antenna (shown here as a body coil 13). The radio-frequency excitation pulses are generated by a pulse generation unit 15 that is controlled by a pulse sequence controller 17. After an amplification by a radio-frequency amplifier 19 they are supplied to the radio-frequency antenna. The radio-frequency system shown here is only schematically indicated. Typically, more than one pulse generation unit 15, more than one radio-frequency amplifier 19 and a number of radio-frequency antennas are used in a magnetic resonance apparatus 1.

Furthermore, the magnetic resonance apparatus 1 has gradient coils 21 with which gradient fields for selective slice excitation and for spatial coding of the measurement signal are radiated during a measurement. The gradient coils 21 are controlled by a gradient coil control unit 23 that, like the pulse generation unit 15, is connected with the pulse sequence controller 17.

The signals emitted by the excited nuclear spins are acquired by the body coil 13 and/or by local coils 25, amplified by associated radio-frequency preamplifiers 27 and further processed and digitized by an acquisition unit 29.

Given a coil that can be operated both in transmission mode and in acquisition mode (such as, for example, the body coil 13), the correct signal relaying is regulated by an upstream transmission-reception diplexer 39.

An image processing unit 31 generates from the measurement data an image that is shown to a user via an operation console 33 or is stored in a storage unit 35. A central computer 37 controls the individual system components. The computer 37 is fashioned such that the inventive method can be implemented therewith.

Figure 2:
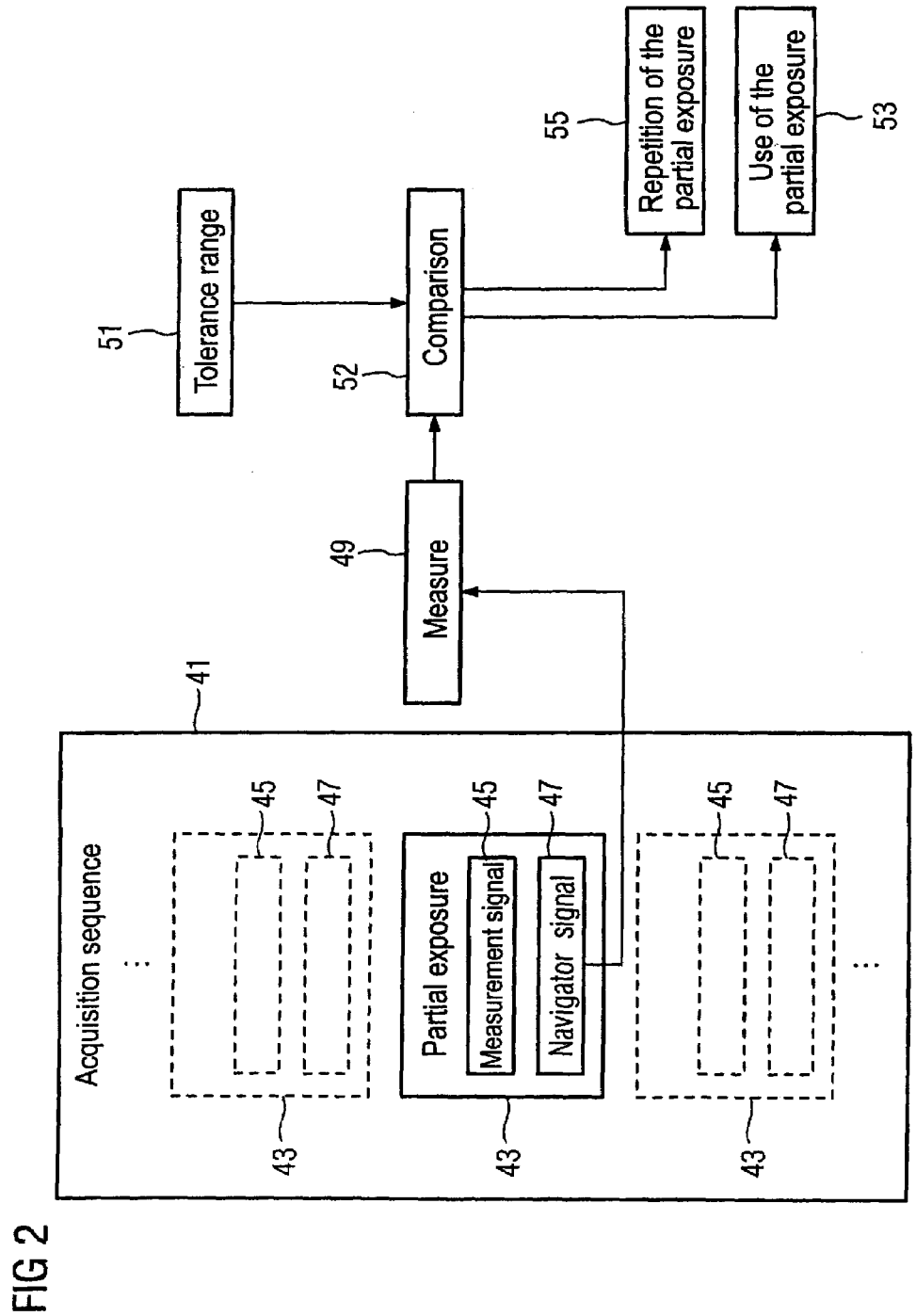
FIG. 2 is a schematic overview of the method in which the image data are acquired with a "multi-shot" acquisition sequence.

FIG. 2 shows a schematic overview of the inventive method with which the image data are acquired for a magnetic resonance image. As is typical in magnetic resonance imaging, k-space corresponding to the image space (more precisely a k-space matrix corresponding to the image matrix) is scanned with the measurement signals. The values of the k-space matrix and the values of the image matrix of the magnetic resonance image to be reconstructed are thereby linked via a Fourier transformation.

The acquisition sequence 41 that is applied in the illustrated embodiment the inventive method if a type known as a "multi-shot" method. This means that the image data are acquired in a plurality of partial acquisitions 43, with a measurement signal that respectively scans a different segment of the k-space matrix being acquired in each partial acquisition 43.

In addition to the actual measurement signal 45, a navigator signal 47 that always scans the same multi-dimensional range of the k-space matrix is acquired in every partial exposure 43. In the image reconstruction the navigator signal 47 is used, among other things, to determine the phase distribution in the individual partial images that are respectively reconstructed from the measurement signals 45 of a partial acquisition 43 and to account for and thus to correct disturbances due to movement upon the merging of the individual partial images, such that optimally few disruptive interferences occur.

As illustrated above, phase distributions always arise during the acquisition of the measurement signals 45 when excited nuclear spins move along magnetic field gradients. Depending on the movement pattern, this can generate a simple phase distribution (like a global phase displacement) in the image space or a local, strongly varying phase distribution.

The navigator signal 47 typically scans only one small, central multi-dimensional range of the k-space matrix. When a radio-frequency phase distribution has occurred due to the movement of the subject in a partial exposure 43, the phase distribution can be only insufficiently reconstructed using the navigator signal 47 that only contains the low-frequency portions of the phase distribution.

In the inventive method, a measure 49 that characterizes the breadth of the distribution of the signal values of the navigator signal 47 relative to the k-space matrix (and thus correlates with the distribution of radio-frequency and low-frequency portions in the navigator signal 47) is determined from the navigator signal 47. A navigator signal 47 with a narrow distribution of the signal values indicates a phase distribution that is predominantly characterized by low-frequency components. Since the navigator signal 47 typically scans central regions of the k-space matrix (thus the low-frequency components), the phase distribution can be reconstructed well from a navigator signal 47 with a narrow distribution of the signal values. By contrast, a navigator signal 47 with a broad distribution of the signal values indicates a phase distribution with non-negligible radio-frequency portions, such that the phase distribution can insufficiently be reconstructed from the navigator signal 47.

In a next step the comparison 52 of the determined measure 49 with a tolerance range 51 ensues. Depending on whether the determined measure 49 lies within the tolerance range 51 or not, use 53 of the partial exposures 43 for the image reconstruction or a repetition 55 of the partial exposure 43 ensues.

The tolerance range 51 can be established in different ways. One possibility is to establish the tolerance range 51 a priori for a specific examination type, for example using preliminary tests. Which breadth the distributions of the signal values of the navigator signals 47 typically exhibit relative to the k-space matrix and how severely the image quality is influenced by this can be estimated with such preliminary tests. Another possibility with which the tolerance range 51 can be adapted to the respective conditions in an exposure is now explained using FIG. 3.

Figure 3:
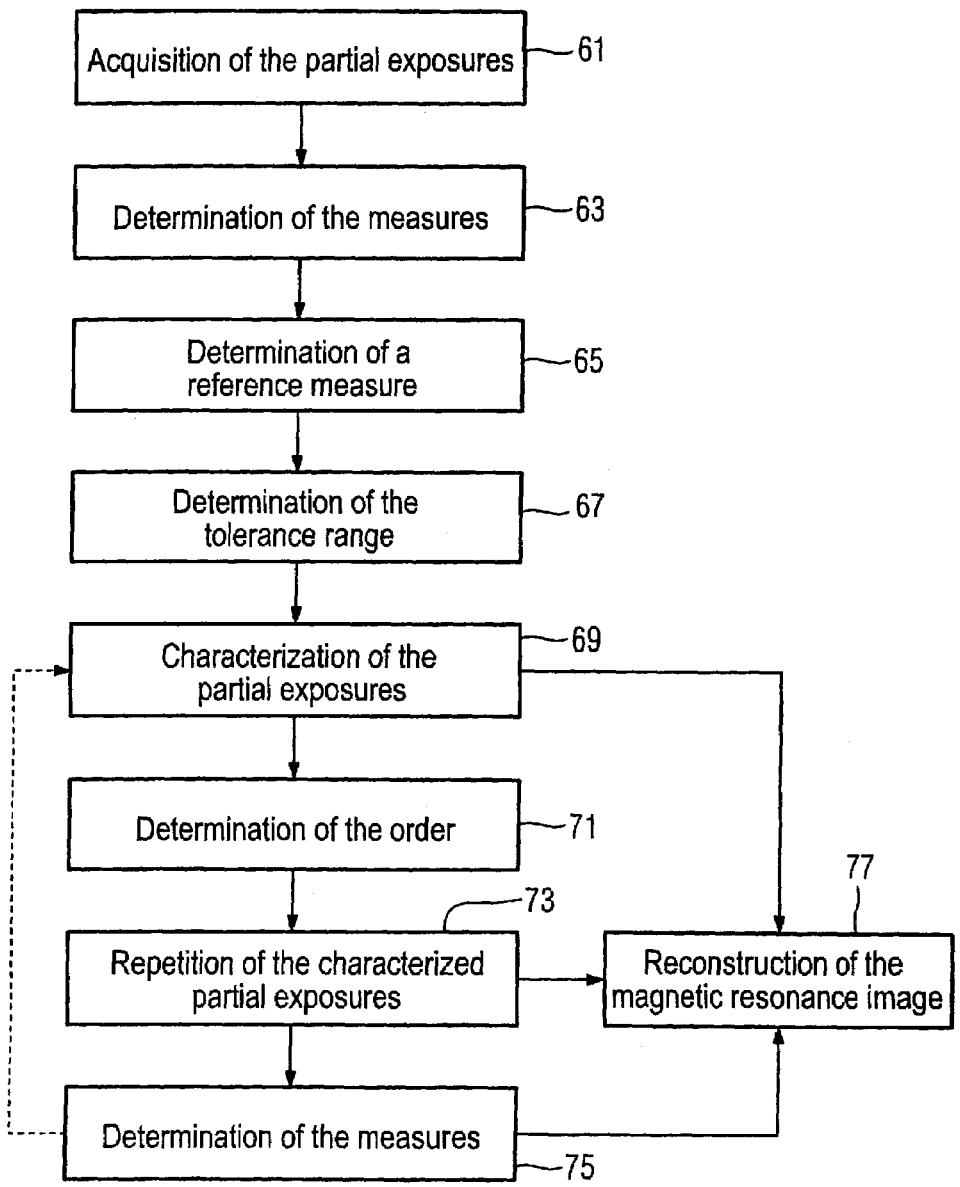
FIG. 3 shows the steps that are implemented in a preferred embodiment of the invention method.

FIG. 3 shows the method steps of a preferred embodiment of the method for acquisition of the magnetic resonance image data.

The acquisition of all partial acquisitions 43 required for reconstruction of the magnetic resonance image data ensues in a first step 61. A special acquisition sequence in which a k-space matrix corresponding to the image data and with a plurality of partial acquisitions 43 is scanned in segments is explained later using FIG. 4 and FIG. 5.

Figure 4:
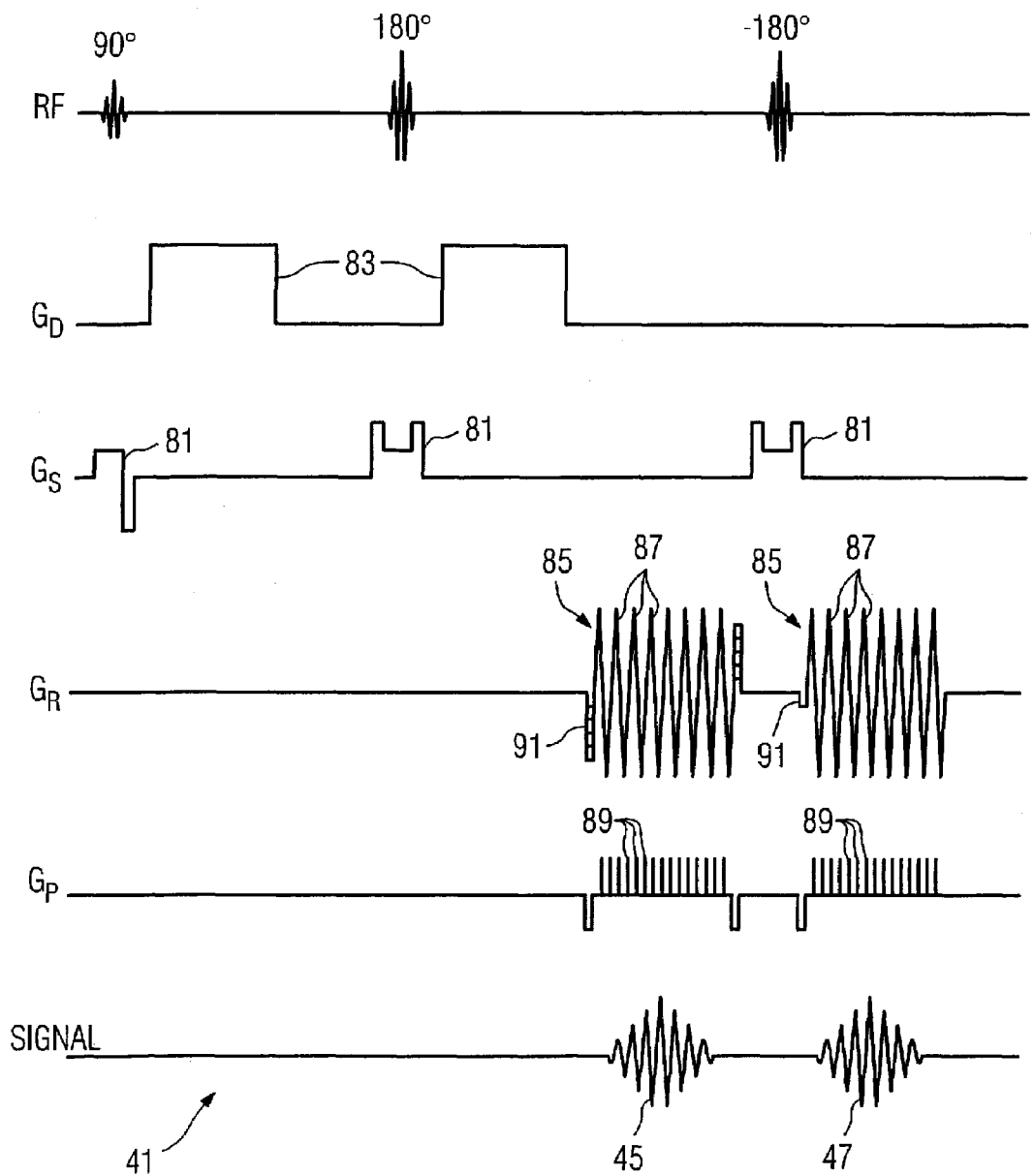
FIG. 4 illustrates an acquisition sequence in which the method steps are implemented.
Figure 5:
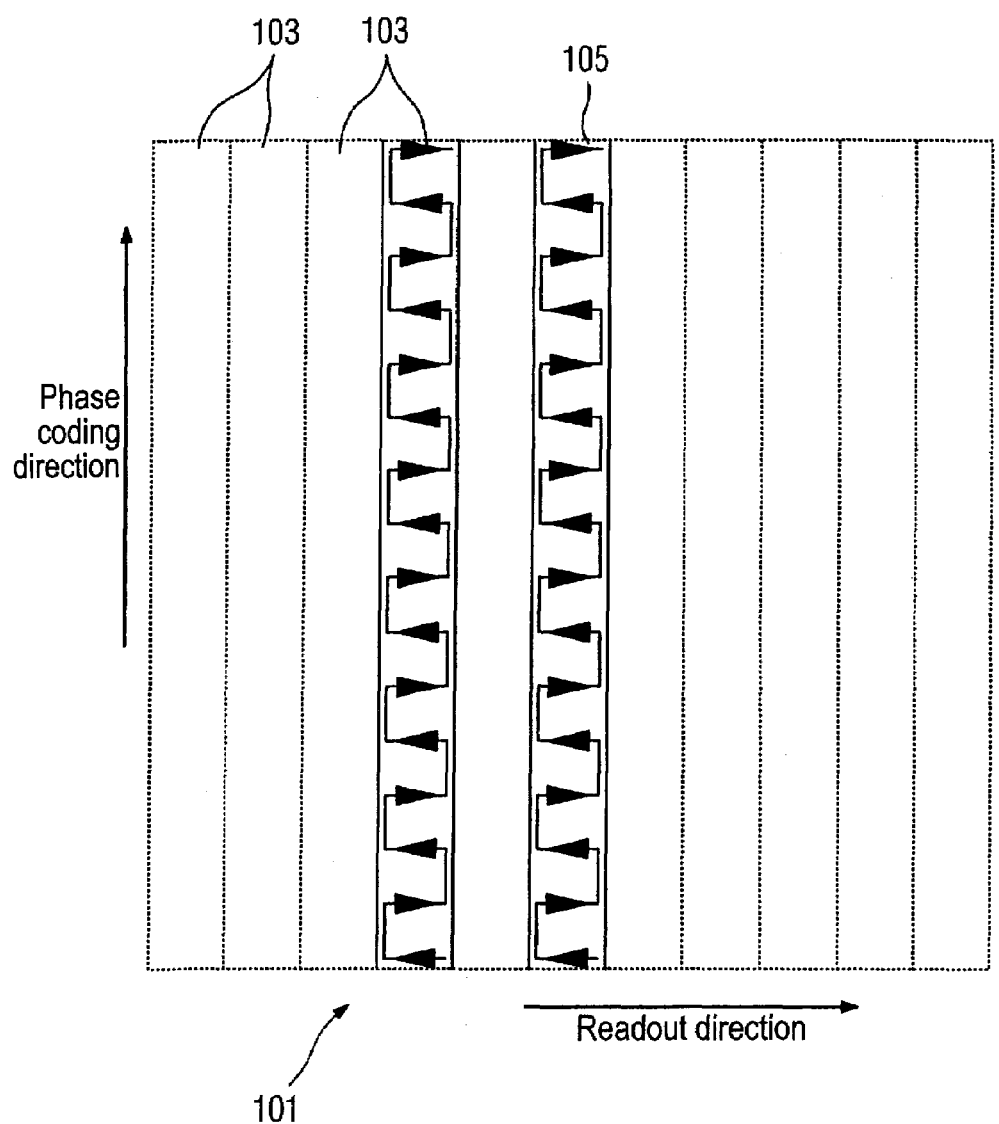
FIG. 5 shows a k-space matrix segmented corresponding to the acquisition sequence.

The evaluation of the navigator signals 47 of each partial acquisition 43 ensues in a second step 63 with regard to the breadth of the distribution of the signal values relative to the k-space matrix. For each navigator signal 47 a measure 49 is respectively determined that characterizes the breadth of the distribution of its signal values. An embodiment of a method of the calculation of the measure 49 for the acquisition sequence shown in FIG. 4 and FIG. 5 is explained after the specification regarding FIG. 4 and FIG. 5=

That measure that characterizes the smallest breadth of the distribution of the signal values is determined as a reference measure in a third step 65 under the determined measures 49. This measure is this associated with that navigator signal 47 from whose distribution of the signal values the phase distribution can be best determined since the frequency spectrum of the phase distribution exhibits the greatest proportion of low-frequency portions that have also been detected through the navigator signal 47.

A tolerance range 51 is established in a fourth step 67 by this reference measure, more precisely via a multiple of the reference measure. The tolerance range is thereby established as that range that lies below the multiple of the reference measure. The navigator signals 47 whose measures 49 lie within the tolerance range 50 (whose distribution of the signal values thus exhibits a comparably small breadth) can be used for the reconstruction of the magnetic resonance image. However, the navigator signals 47 whose measures 49 lie outside of the tolerance range 51 (whose distribution of the signal values is thus relatively broad) are not suitable for sufficiently precisely determining the phase distribution in the associated partial image, such that the associated partial images would lead to artifacts in the magnetic resonance image.

The factor with which the reference measure is multiplied in order to obtain a tolerance range appropriate for the image quality thereby depends on the respective examination and can be determined, for example, using preliminary tests.

Those partial acquisition 43 whose associated navigator signals 47 respectively exhibit a measure 49 outside of the tolerance range 51 are therefore characterized in a fifth step 69. Those partial acquisitions 43 whose measures lie within the tolerance range 51 can be used directly for the reconstruction of the magnetic resonance image that is implemented in a ninth step 77.

In a sixth step 71 the order is determined with which the partial acquisitions 43 to be repeated are acquired. That partial acquisition whose associated k-space segment lies most centrally in the k-space matrix is repeated next.

The repeated acquisition of the characterized partial acquisitions with the order established in the sixth step 71 ensues in a seventh step 73.

An advantage of this procedure is that the central segments that are more important for the reconstruction of the magnetic resonance image are acquired first. In the event that the acquisition of the data must be unexpectedly terminated early, a magnetic resonance image therefore can often nevertheless be reconstructed from the already-acquired data, the quality of which magnetic resonance image is sufficient to answer the clinical question.

As already illustrated, the phase distribution that a partial image reconstructed from a partial acquisition 43 exhibits depends on the movement pattern of the subject at the point in time of the acquisition. Since only those partial acquisitions 43 with a too-significantly varying phase distribution are repeated (thus those partial acquisitions 43 in which the subject to be examined has executed a relatively complex movement at the point in time of the acquisition), a majority of the repeated partial acquisitions 43 exhibit an advantageous phase distribution.

After the repetition of the partial acquisitions 43, the repeated partial acquisitions can be used for the reconstruction of the magnetic resonance image implemented in the ninth step 77.

If desired, the repeated partial acquisition 43 (more precisely the distributions of the signal values of the respective associated navigator signals 47 can be newly evaluated in an eighth step 75 with regard to their breadth with a measure 49 as has analogously been implemented in a second step 63. Analogous to the fifth step 69, those partial acquisitions 43 are newly characterized for repetition when the measures 49 lie outside of the tolerance range. A sorting of the partial acquisitions to be newly repeated thereupon again ensues analogously to the sixth step 71 and a reacquisition analogously ensues in a seventh step 73.

This process can be iteratively continued until all measures that are determined in the repeated partial acquisitions 43 lie inside the tolerance range 51 or until the acquisition time has exceeded a previously established time maximum.

FIG. 4 shows an acquisition sequence in which the inventive method is implemented and FIG. 5 shows the corresponding k-space matrix 101 that is scanned by the acquisition sequence.

The acquisition sequence 41 shows a diffusion-weighted, navigator-based sequence in a "multi-shot" method with an echoplanar imaging (EPI) in which a scan of k-space is implemented via mosaic-like segments in the readout direction. Such a sequence is known from Porter D A, Mueller E, "Multi-shot diffusion-weighted EPI with readout mosaic segmentation and 2D navigator correction" in Proceedings, ISMRM, 12th Annual Meeting, Kyoto, Japan 2004, p. 442 or (in a more easily modified form without acquisition of navigator signals) from DE 103 18 990 A1.

An initial 90° excitation pulse is shown in the uppermost line RF (RF for "radio frequency"), followed by two 180° refocusing pulses. These radio-frequency pulses serve to excite the nuclear spins to a precession movement or to again refocus the nuclear spin signals diverging during the precession movement.

A slice-selection gradient 81 (line $G_S$) is respectively switched for selection of a specific slice during the 90° excitation pulse as well as during the 180° refocusing pulse. After the 90° excitation pulse and after the first 180° refocusing pulse, a diffusion gradient 83 (line $G_D$) is activated in a known manner for diffusion-weighted imaging.

The readout of the spin echo signals (more precisely of the measurement signal 45 and of the navigator signal 47) (line Signal) ensues in the form of gradient echoes with what is respectively known as a readout gradient pulse train (line $G_R$). The readout gradient pulse train 85 includes a number of alternating (for example sinusoidal or trapezoidal) partial pulse trains 87 in the readout direction that are applied during the readout of the spin echo signals. A short phase coding gradient 89 (line $G_P$) is activated during each zero crossing of the readout gradient pulse train 85. The combination of alternating partial pulse trains 87 and phase coding gradients 89 leads to the situation of only a relatively narrower range of the k-space matrix 101 with regard to the readout direction being scanned upon each read spin echo, while the entire breadth of the k-space matrix 101 is scanned in the phase coding direction.

In each partial acquisition 43 a different k-space segment 103 of a k-space matrix 101 is scanned during the readout of the measurement signal 45. For this purpose a variable pre-gradient 91 is activated before each readout gradient pulse train 85 in each partial acquisition 43, the variable pre-gradient 91 leading to a different offset in the readout direction in each partial acquisition 43 such that a different k-space segment 103 of the k-space segments 103 (shown eleven times in total in FIG. 5) is respectively scanned. The scanning of a non-central k-space segment 103 by the measurement signal 45 is shown in FIG. 5.

The area integral of a partial pulse train 87 in the readout gradient pulse train 85 establishes the width of the scanned k-space segment 103 of the k-space matrix 101 in the readout direction. The area integral of the pre-gradient 91 likewise defines the offset of the k-space segment 103 in the readout direction. After the readout gradient pulse train 85 the pre-gradient 91 is activated inverted in order to again reset the offset.

The readout of the navigator signal 47 ensues in an analogous manner. The pre-gradient 91 is thereby constant in each partial acquisition 43 and leads to the signal that the same central k-space segment 105 of the k-space matrix 101 is always scanned. The spin echo so read out serves as a navigator signal 47 with which the phase distribution in image space is determined in the individual partial images in the reconstruction of the magnetic resonance image and is taken into account in the merging of the individual partial images.

After acquisition of all partial acquisitions 43, a measure 49 that specifies the breadth of the distribution of the signal values of the navigator signal 47 is determined in each partial acquisition 43. For the acquisition sequence shown in FIG. 4, the determination of the measure $W_x$ ensues according to the following correlation:

$$W_x = \sum_{k_y=0}^{n_y-1} \sum_{k_x=0}^{n_x-1} |S(k_x, k_y)| \cdot |k_x - \Omega_x|$$

wherein $k_x$ thereby characterizes the coordinate values of k-space in the readout direction, $k_y$ in the phase coding direction. $n_x$ and $n_y$ specify the number of the scanned data points in the readout direction and phase coding direction, respectively. $S(k_x, k_y)$ is the complex k-space signal and $\Omega_x$ is the $k_x$-coordinate of the data point with the maximum signal amplitude.

The measure $W_x$ that characterizes the breadth of the distribution of the signal values of the navigator signal 47 relative to the central k-space segment 105 is, in this example, determined in a manner similar to the evaluation of the scatter of a probability distribution using the average absolute deviation relative to the maximum of the probability distribution.

Upon the determination of the measure $W_x$ the entirety of the information of the central two-dimensional k-space segment 105 that has been scanned by the navigator signal 47 is used.

The intervals of the coordinates of the signal values relative to the coordinate of the signal maximum ($|k_x - \Omega_x|$) are considered only in the readout direction given the determination of the deviation of the signal values.

The characteristic that the absolute deviation from the signal maximum is determined only in the readout direction is connected with the special two-dimensional form of the central k-space segment 105 that is scanned by the navigator signal:

In the acquisition sequence shown, here a k-space segment 105 is scanned by the navigator signal 47 that scans only a relatively narrow portion of the k-space matrix 101 in the readout direction while the entire length of the k-space matrix 101 is always scanned in the phase coding direction orthogonal thereto. For the phase distribution in a partial image that is determined from the navigator signal 47, this means that both low-frequency and radio-frequency portions are taken into account in the y-direction but only low-frequency portions are considered in the x-direction. The y-direction is the direction in image space (image domain) that corresponds to the phase coding direction in k-space; the x-direction is the direction in image space that corresponds to the readout direction in k-space.

The determined measure $W_x$ that specifies the breadth of the distribution of the signal values in the readout direction consequently gives information about how large the dimension of the radio-frequency portions of the phase distribution is in the x-direction, which cannot be determined through the navigator signal 47. A smaller value of the measure $W_x$ (connected with a narrow distribution of the signal values of the navigator signal 47 in the readout direction) indicates that significant portions of the frequency spectrum of the phase distribution have been detected by the navigator signal 47. In contrast to this, a large value of the measure $W_x$ (and with it a broad distribution of the signal values of the navigator signal 47 in the readout direction) indicates that the frequency spectrum of the phase distribution comprises a not-insignificant extent of radio-frequency portions that have not been detected by the navigator signal 47, such that upon a repetition of these partial acquisitions 43, a phase distribution that is more advantageous and can be determined better can be expected.

The breadth of the distribution of the signal values of a navigator signal 47 in the readout direction therefore indicates how large the proportion is of the information relative to the phase distribution in the readout direction that has not been detected by the navigator signal 47.

When the k-space segment that is scanned by the navigator signal 47 exhibits a different form than the central k-space segment 105 shown in FIG. 5, (for example) when the entire width of the k-space matrix is scanned neither in the phase coding direction nor in the readout direction, it is advantageous to use a measure 49 that also takes the breadth of the distribution of the signal values in the phase coding direction into account in addition to the breadth of the distribution of the signal values in the readout direction.

This can be achieved by the measure 49 taking into account both the absolute deviation of the distribution of the signal values in the readout direction and the absolute deviation of the distribution of the signal values in the phase coding direction, for example via a product of two quantities $G_x$, $G_y$:

$$G_x = \sum_{k_y=0}^{n_y-1} \sum_{k_x=0}^{n_x-1} |S(k_x, k_y)| \cdot |k_x - \Omega_x|,$$

$$G_y = \sum_{k_y=0}^{n_y-1} \sum_{k_x=0}^{n_x-1} |S(k_x, k_y)| \cdot |k_y - \Omega_y|$$

that are calculated in a manner analogous to the measure $W_x$ described above.

Alternatives to determine the breadth of a distribution of the signal values of a navigator signal 47 relative to the k-space matrix 101 are the determination of other quantities that characterize the breadth of a distribution, such as, for example, the variance or the standard deviation of a distribution relative to the maximum or the focal point of the distribution.

It is likewise possible to fit the distribution of the signal values with a model curve, for example a two-dimensional Gaussian curve and to determine the measure 49 that characterizes the breadth from the fit parameters (for example the standard deviation of the Gaussian curve).

Figure 6:
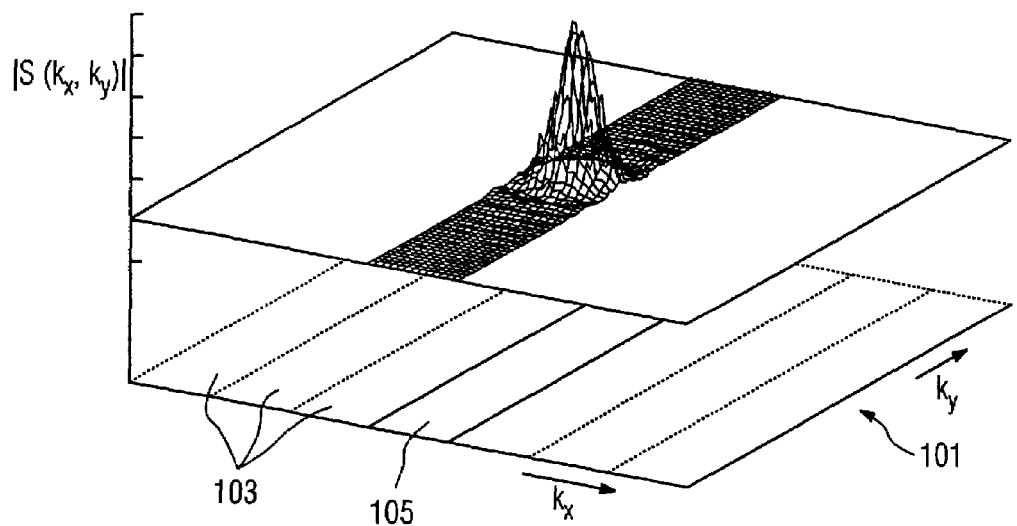
FIG. 6 shows a distribution of signal values of a navigator signal relative to the k-space matrix with a low breadth.
Figure 7:
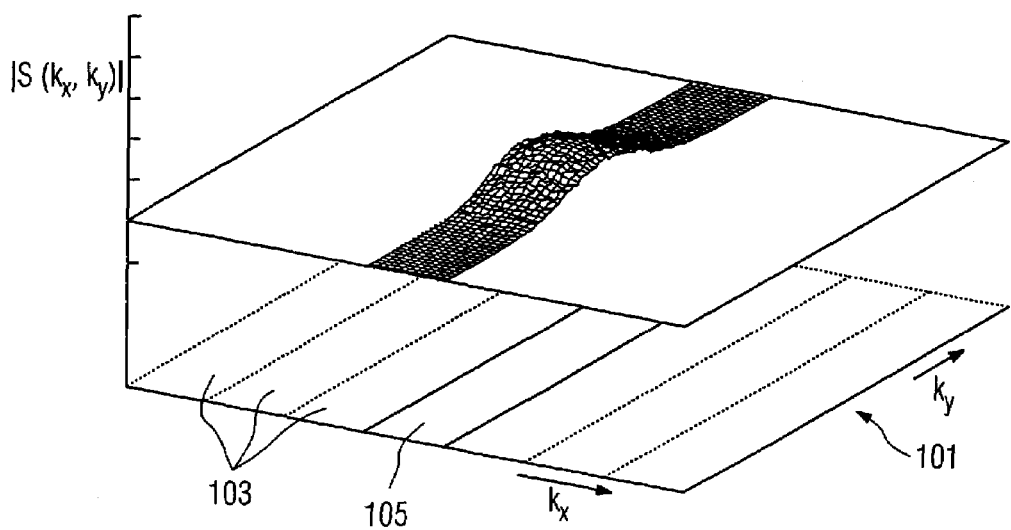
FIG. 7 shows a further distribution of signal values of a navigator signal relative to the k-space matrix with a larger breadth.

The concept of the breadth of a distribution of signal values relative to the k-space matrix 101 is now explained using FIG. 6 and FIG. 7. The shown distributions are idealized distributions but allow the concept to be clearly explained. A distribution of signal values relative to the k-space matrix 101 (more precisely relative to that central k-space segment 105 that is scanned by the navigator signal 47) is shown in FIG. 6 and FIG. 7. The absolute magnitude of the complex signal values of the navigator signal 47 plotted relative to the coordinates of the two-dimensional k-space matrix 101 (whose coordinates are a readout direction and a phase coding direction) is shown.

The concept of the breadth of a distribution of signal values using a two-dimensional k-space matrix 101 and a two-dimensional central k-space segment 105 is explained in the example, but the concept can be transferred in an analogous manner to a three-dimensional k-space matrix or a three-dimensional k-space segment. Furthermore, the illustrated distributions show idealized cases with which the concept of the breadth of a distribution can be explained.

During the scanning of the central k-space segment in FIG. 6 and FIG. 7, a subject to be examined respectively exhibits a different movement pattern.

For the distribution shown in FIG. 6 the movement pattern is such that only a simple phase distribution formed by low-frequency portions has occurred A distribution with a comparably small breadth results from this, such that the phase distribution can be reconstructed well from the navigator signal 47 itself in the readout direction.

In the distribution shown in FIG. 7 the movement pattern is complex, such that the phase distribution also includes significant radio-frequency portions. Among other things, this also influences the distribution of the signal values that now turns out comparably broad. In particular in the readout direction, the phase distribution cannot be determined sufficiently correctly by the comparably narrow k-space matrix 105 since significant portions for determination of the actual occurred phase distribution have not been scanned by the navigator signal 47.

Although modifications and changes may be suggested by those skilled in the art, it is the intention of the inventor to embody within the patent warranted hereon all changes and

I claim as my invention:

1. A method for acquiring magnetic resonance image data for producing a magnetic resonance image therefrom, comprising the steps of:
   in a magnetic resonance image data acquisition sequence, acquiring magnetic resonance image data by scanning a k-space matrix in segments with at least two partial data acquisitons;
   in each of said partial data acquisitions, generating a navigation signal, in addition to a measurement signal with which a respective k-space segment is scanned, said navigator signal scanning a same multi-dimensional navigator segment of said k-space matrix in each of said partial acquisitions;
   for at least one of said partial acquisitions, automatically electronically determining a measure that characterizes a breadth of a distribution of signal values of the navigator signal with regard to said k-space matrix; and
   repeating said at least one of said partial acquisitions if said measure lies outside of a tolerance range, to ultimately acquire an image data set suitable for reconstructing a magnetic resonance image therefrom.

2. A method as claimed in claim 1 comprising automatically electronically determining said measure as a characterization of a breadth of said distribution of said signal values of said navigator signal in a multi-dimensional range.

3. A method as claimed in claim 1 comprising automatically electronically determining said measure for each of at least two of said partial acquisitions, and automatically electronically determining said tolerance range by setting the respective measures for said at least two partial acquisitions in relation to each other.

4. A method as claimed in claim 3 comprising automatically electronically determining said tolerance range from the measure associated with a navigator signal having a smallest breadth of said distribution.

5. A method as claimed in claim 4 comprising automatically electronically determining said tolerance range as a range lying below a threshold, and automatically electronically determining said threshold as a multiple of said measure associated with the navigator signal having said smallest breadth of said distribution.

6. A method as claimed in claim 1 comprising automatically electronically determining said breadth of said distribution in a direction embodied in said k-space matrix selected from the group consisting of a readout direction and a phase coding direction.

7. A method as claimed in claim 1 comprising automatically electronically determining said measure as a sum formed by absolute magnitudes of signal values that are respectively multiplied by a distance of their associated k-space coordinates from a k-space coordinate of a maximum of said distribution.

8. A method as claimed in claim 1 comprising automatically electronically determining said measure for each of at least two of said partial acquisitions, and automatically electronically determining said tolerance range by setting the respective measures for said at least two partial acquisitions in relation to each other, and repeating any of said at least two partial acquisitions for which the respective measure lies outside of said tolerance range.

9. A method as claimed in claim 8 comprising, if more than one of said partial acquisitions is repeated, ordering a sequence of said repetition dependent on a position of the respective k-space segments associated with the measures with a most centrally positioned k-space segment being repeated first.

10. A method as claimed in claim 1 comprising employing a two-dimensional navigator signal as said navigator signal.

11. A method as claimed in claim 1 comprising employing, as said partial acquisition sequences, acquisition sequences using at least one of gradient echoes and spin echoes.

12. A method as claimed in claim 1 comprising employing, as said partial acquisition sequences, acquisition sequences for diffusion-weighted imaging.

13. A magnetic resonance apparatus for acquiring magnetic resonance image data for producing a magnetic resonance image therefrom, comprising:
   a magnetic resonance scanner configured to interact with a subject to acquire magnetic resonance data therefrom;
   a computer that operates said scanner to, in a magnetic resonance image data acquisition sequence, acquire magnetic resonance image data by scanning a k-space matrix in segments with at least two partial data acquisitons;
   said computer, in each of said partial data acquisitions, generating a navigation signal, in addition to a measurement signal with which a respective k-space segment is scanned, said navigator signal scanning a same multi-dimensional navigator segment of said k-space matrix in each of said partial acquisitions;
   said computer, for at least one of said partial acquisitions, automatically determining a measure that characterizes a breadth of a distribution of signal values of the navigator signal with regard to said k-space matrix; and
   said computer repeating said at least one of said partial acquisitions if said measure lies outside of a tolerance range, to ultimately acquire an image data set suitable for reconstructing a magnetic resonance image therefrom.

14. A magnetic resonance apparatus as claimed in claim 13 wherein said computer automatically determines said measure as a characterization of a breadth of said distribution of said signal values of said navigator signal in a multi-dimensional range.

15. A magnetic resonance apparatus as claimed in claim 13 wherein said computer automatically determines said measure for each of at least two of said partial acquisitions, and automatically determines said tolerance range by setting the respective measures for said at least two partial acquisitions in relation to each other.

16. A magnetic resonance apparatus as claimed in claim 15 wherein said computer automatically determines said tolerance range from the measure associated with a navigator signal having a smallest breadth of said distribution.

17. A magnetic resonance apparatus as claimed in claim 16 wherein said computer automatically determines said tolerance range as a range lying below a threshold, and automatically determines said threshold as a multiple of said measure associated with the navigator signal having said smallest breadth of said distribution.

18. A magnetic resonance apparatus as claimed in claim 13 wherein said computer automatically determines said breadth of said distribution in a direction embodied in said k-space matrix selected from the group consisting of a readout direction and a phase coding direction.

19. A magnetic resonance apparatus as claimed in claim 13 wherein said computer automatically determines said measure as a sum formed by absolute magnitudes of signal values that are respectively multiplied by a distance of their associated k-space coordinates from a k-space coordinate of a maximum of said distribution.

20. A magnetic resonance apparatus as claimed in claim 13 wherein said computer automatically determines said measure for each of at least two of said partial acquisitions, and automatically determines said tolerance range by setting the respective measures for said at least two partial acquisitions in relation to each other, and repeating any of said at least two partial acquisitions for which the respective measure lies outside of said tolerance range.

21. A magnetic resonance apparatus as claimed in claim 20 wherein said computer, if more than one of said partial acquisitions is repeated, orders a sequence of said repetition dependent on a position of the respective k-space segments associated with the measures with a most centrally positioned k-space segment being repeated first.

22. A magnetic resonance apparatus as claimed in claim 13 wherein said computer employs a two-dimensional navigator signal as said navigator signal.

23. A magnetic resonance apparatus as claimed in claim 13 wherein said computer operates said scanner with partial acquisition sequences, acquisition sequences using at least one of gradient echoes and spin echoes.

24. A magnetic resonance apparatus as claimed in claim 13 wherein said computer operates said scanner with partial acquisition sequences for diffusion-weighted imaging.

* * * * *